| (12) | United States Patent | (10) Patent No.: | US 9,841,670 B2 |
|---|---|---|---|
| | Kohmura et al. | (45) Date of Patent: | Dec. 12, 2017 |

(54) SUPPORT FRAME FOR PELLICLES

(71) Applicant: NIPPON LIGHT METAL COMPANY, LTD., Tokyo (JP)

(72) Inventors: Kazuo Kohmura, Yamaguchi (JP); Yosuke Ono, Chiba (JP); Daiki Taneichi, Yamaguchi (JP); Yasuyuki Sato, Okayama (JP); Toshiaki Hirota, Okayama (JP); Kiyokazu Koga, Shizuoka (JP)

(73) Assignee: NIPPON LIGHT METAL COMPANY, LTD. (JP)

( * ) Notice: Subject to any disclaimer, the term of this patent is extended or adjusted under 35 U.S.C. 154(b) by 0 days.

(21) Appl. No.: 15/313,918

(22) PCT Filed: May 11, 2015

(86) PCT No.: PCT/JP2015/063505
§ 371 (c)(1),
(2) Date: Nov. 23, 2016

(87) PCT Pub. No.: WO2015/182362
PCT Pub. Date: Dec. 3, 2015

(65) Prior Publication Data
US 2017/0212418 A1    Jul. 27, 2017

(30) Foreign Application Priority Data

May 26, 2014 (JP) ................................. 2014-107767
Feb. 10, 2015 (JP) ................................. 2015-024599

(51) Int. Cl.
*G03F 7/20* (2006.01)
*G03F 1/64* (2012.01)
(Continued)

(52) U.S. Cl.
CPC ................. *G03F 1/64* (2013.01); *G03F 1/62* (2013.01); *G03F 1/66* (2013.01); *G03F 7/70866* (2013.01);
(Continued)

(58) Field of Classification Search
CPC ................. G03F 1/64; G03F 1/62; G03F 1/66
See application file for complete search history.

(56) References Cited

U.S. PATENT DOCUMENTS

| 4,833,051 A | 5/1989 | Imamura | |
|---|---|---|---|
| 6,264,773 B1 * | 7/2001 | Cerio | ........................ G03F 1/64 |
| | | | 156/152 |

FOREIGN PATENT DOCUMENTS

| JP | A-S61-245163 | 10/1986 |
|---|---|---|
| JP | A-H10-39494 | 2/1998 |

(Continued)

OTHER PUBLICATIONS

International Search Report and Written Opinion for PCT/JP2015/063505 (dated Jul. 21, 2015).

*Primary Examiner* — Michelle M Iacoletti
(74) *Attorney, Agent, or Firm* — Merchant & Gould P.C.

(57) ABSTRACT

Provided is a support frame for pellicles which includes an aluminum alloy-made frame body with a pellicle film bonded to a front surface of the frame body, and with a glass substrate bonded to a back surface of the frame body. A front-side recessed groove extending in a circumferential direction of the frame body is formed on the front surface of the frame body, and a front-side suction hole extending from an outer peripheral surface of the frame body to an inner surface of the front-side recessed groove is formed on the frame body.

16 Claims, 10 Drawing Sheets

(51) Int. Cl.
 G03F 1/66 (2012.01)
 G03F 1/62 (2012.01)
(52) U.S. Cl.
 CPC ...... G03F 7/70916 (2013.01); G03F 7/70975 (2013.01); G03F 7/70983 (2013.01); *G03F 7/70691* (2013.01)

(56) References Cited

FOREIGN PATENT DOCUMENTS

| | | |
|---|---|---|
| JP | A-2003-107678 | 4/2003 |
| JP | A-2006-215487 | 8/2006 |
| JP | B-4777381 | 9/2011 |

\* cited by examiner

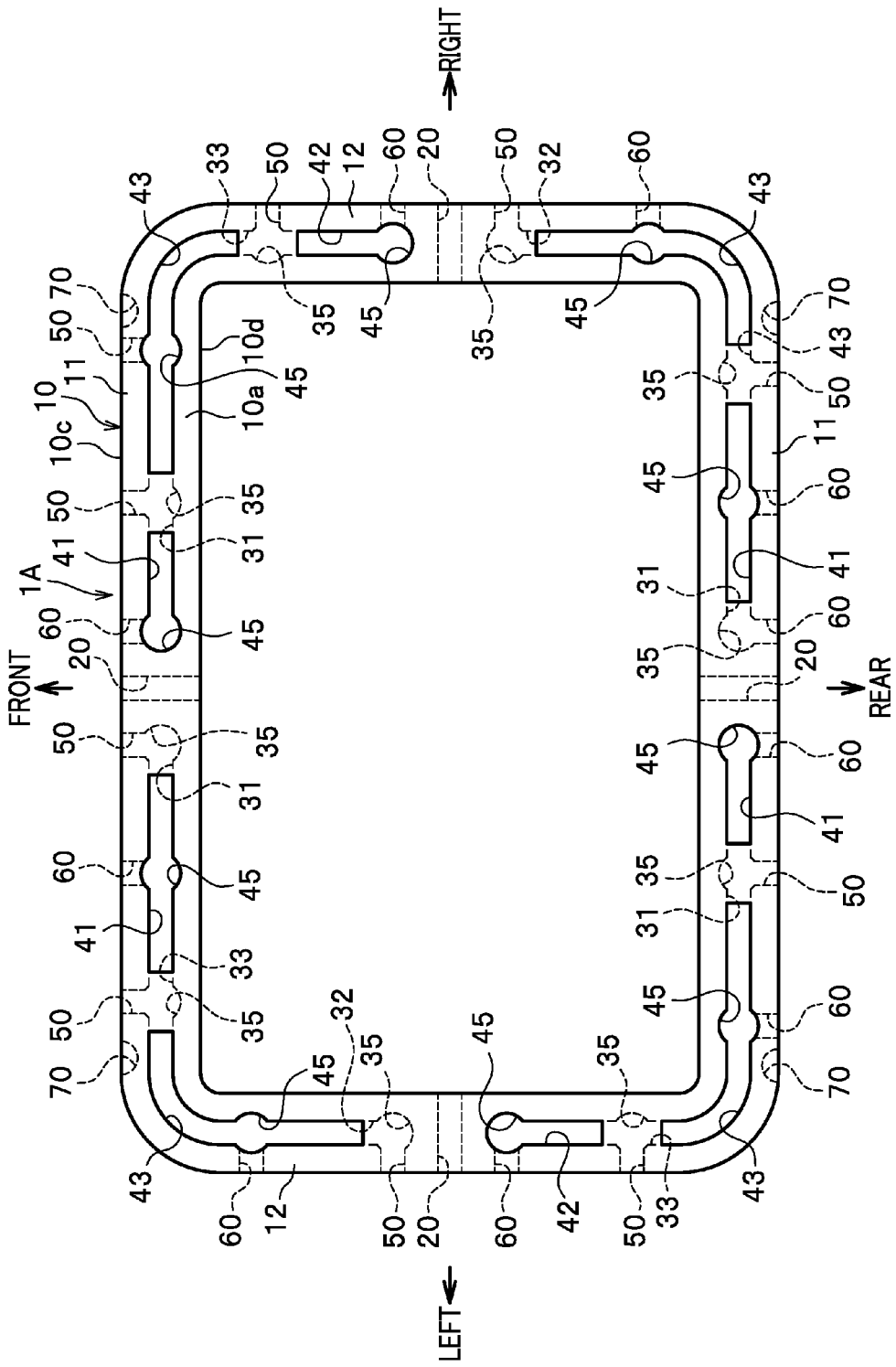

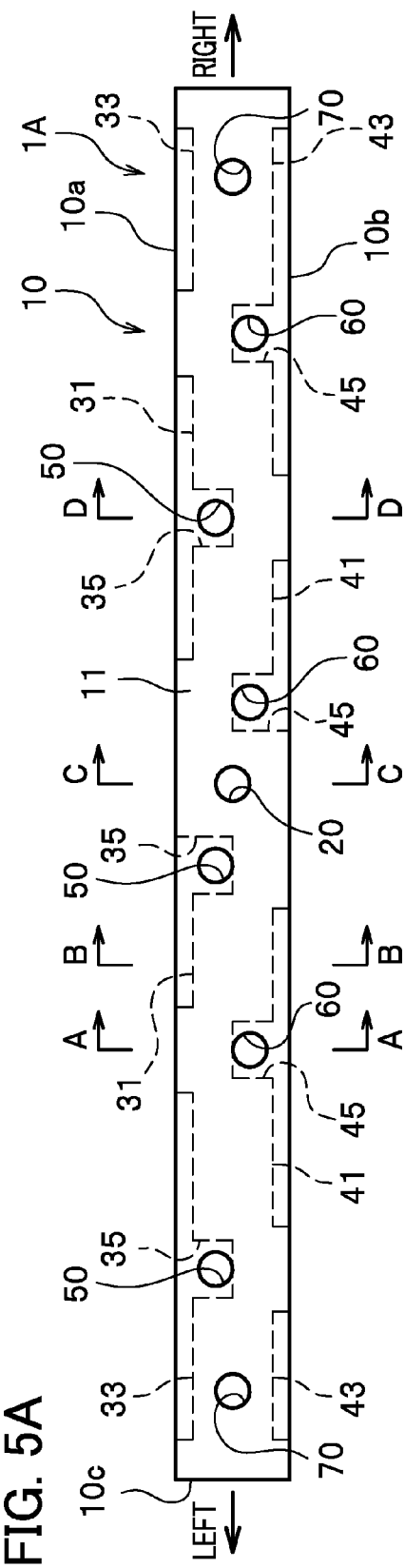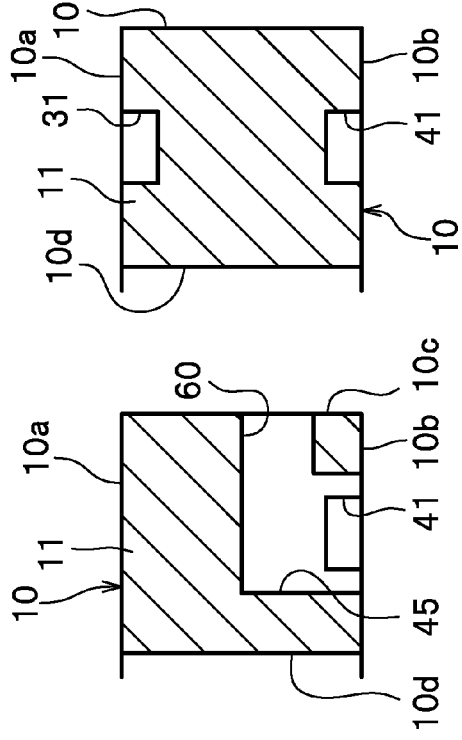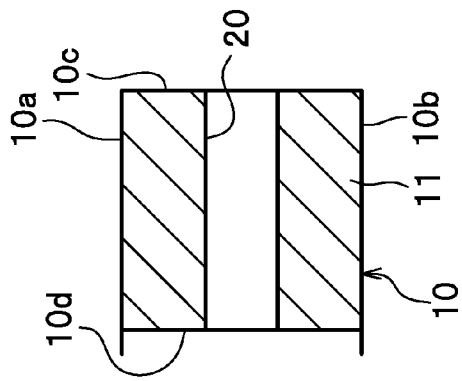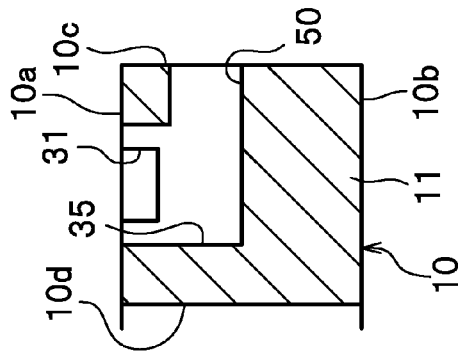

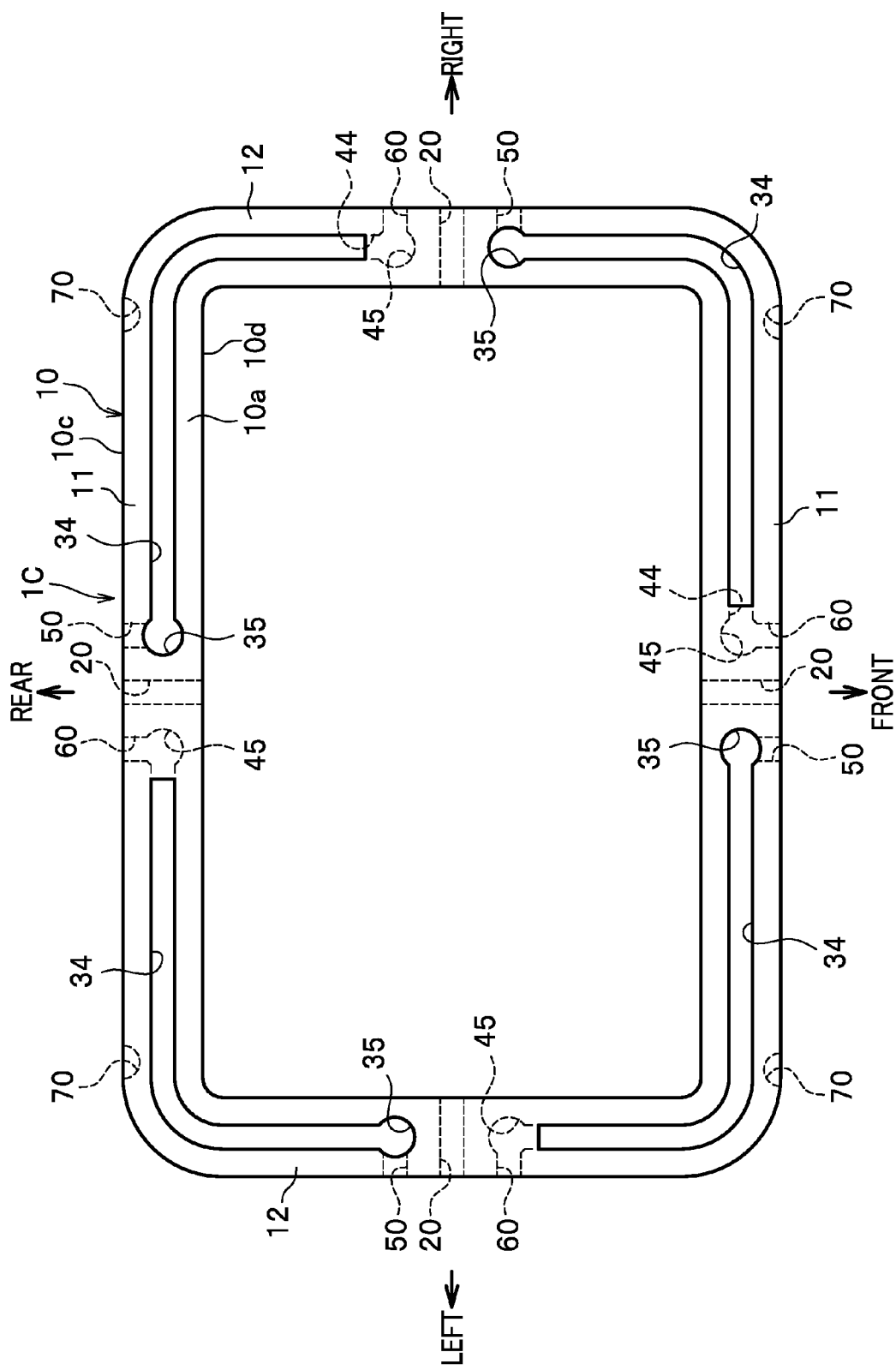

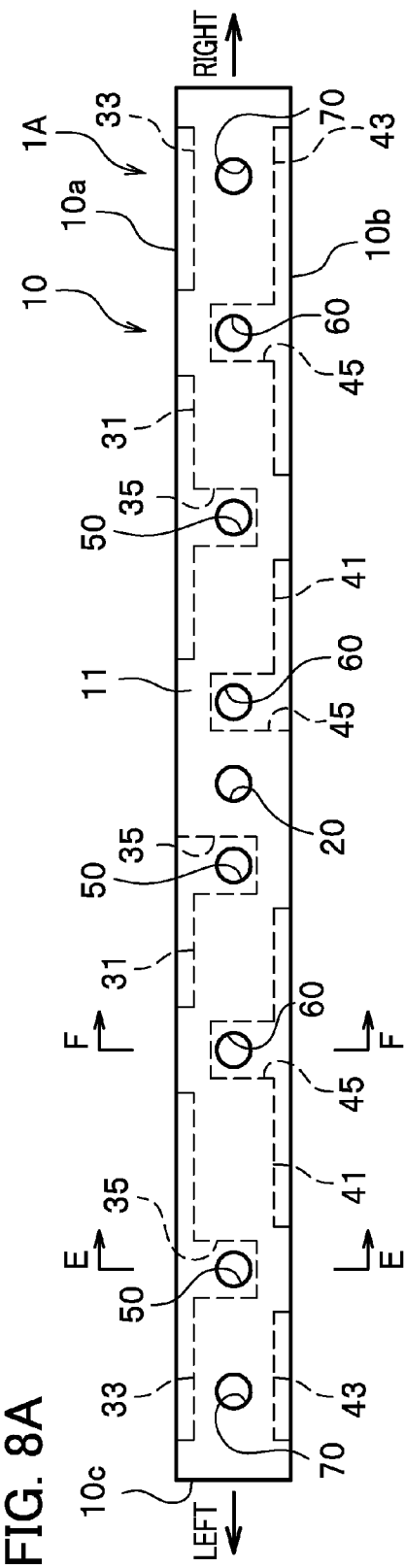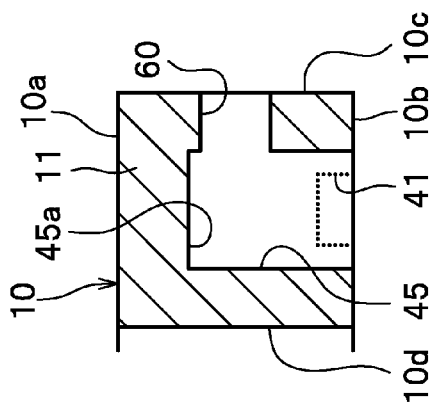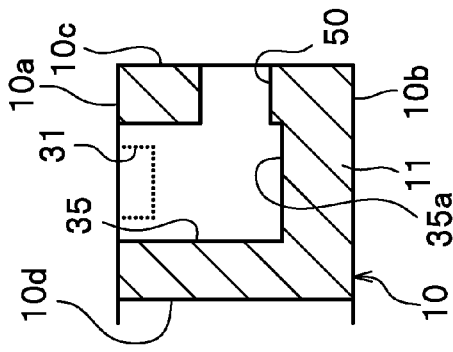

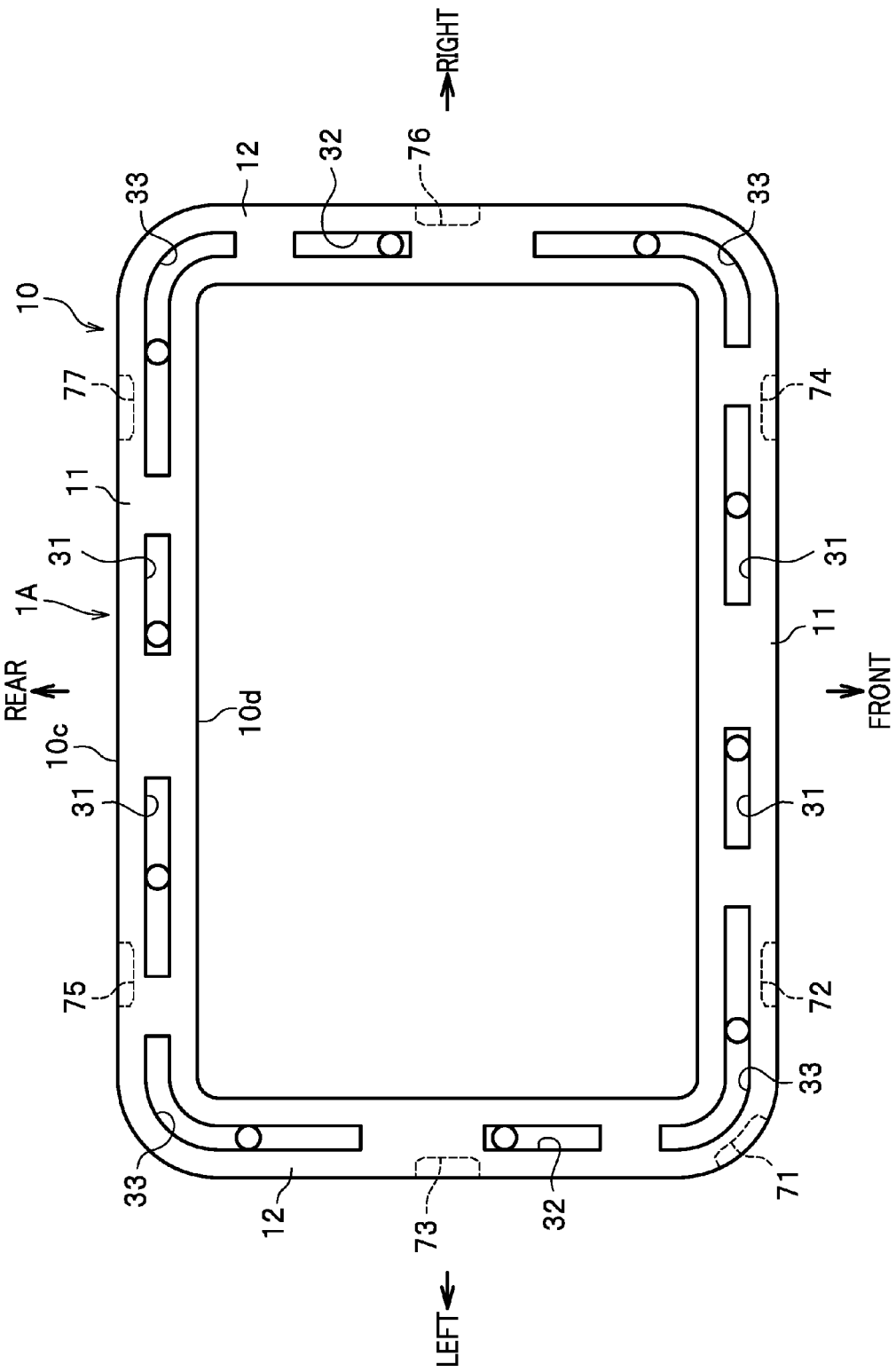

SUPPORT FRAME FOR PELLICLES

This application is a U.S. National Stage Application under 35 U.S.C. §371 of International Patent Application No. PCT/JP2015/063505 filed May 11, 2015, which claims the benefit of priority to Japanese Patent Application No. 2014-107767 filed May 26, 2014 and Japanese Patent Application No. 2015-024599 filed Feb. 10, 2015, the disclosures of all of which are hereby incorporated by reference in their entireties. The International Application was published in Japanese on Dec. 3, 2015 as WO 2015/182362.

TECHNICAL FIELD

The present invention relates to a support frame for pellicles.

BACKGROUND ART

An integrated circuit manufacturing process includes a photolithography step in which a circuit pattern drawn on a glass substrate termed a photomask or reticle is transferred onto a resist applied to a wafer.

When foreign objects such as dust adhere to the glass substrate during the photolithography step, the circuit pattern transferred to the resist becomes blurred. To avoid this, the glass substrate is covered with a dust cover termed a pellicle (see Patent Literature 1, for example)

The pellicle includes: a support frame surrounding the whole of the circuit pattern written on the glass substrate; and a light-transmitting pellicle film, and provided on a front surface of the support frame in a covering manner. In addition, a back surface of the support frame is bonded to the glass substrate.

CITATION LIST

Patent Literature

Patent Literature 1: JP4777381B

SUMMARY OF INVENTION

Technical Problem

The pellicle film is bonded to the support frame by: applying an adhesive to the front surface of the support frame; and thereafter putting the pellicle film on top of the front surface of the support frame. Furthermore, to bond the pellicle film to the support frame, the pellicle film is evenly pressed against the support frame. This method makes the pellicle film more likely to be damaged as the pellicle film becomes thinner.

An object of the present invention is to provide a support frame for pellicles which is capable of solving the foregoing problem, and which enables the pellicle film to be bonded to the frame body without another member being pressed against to the pellicle film.

Solution to Problem

To solve the above problems, the present invention is a support frame for pellicles which includes an aluminum alloy-made frame body with a pellicle film bonded to a front surface of the frame body, and with a glass substrate bonded to a back surface of the frame body. A front-side recessed groove extending in a circumferential direction of the frame body is formed on the front surface of the frame body, and a front-side suction hole extending from an outer peripheral surface of the frame body to an inner surface of the front-side recessed groove is formed on the frame body.

The support frame of the present invention is as follows. Once the pellicle film is put on top of the front surface of the frame body after an adhesive is applied to the front surface of the frame body, the recessed groove is closed with the pellicle film. Once in this condition, air inside the recessed groove is sucked up via a suction hole, pressure inside the recessed groove is decreased. Thereby, the pellicle film is pressed against the front surface of the frame body. In this manner, the support frame of the present invention no longer requires another member to be pressed against the pellicle film when the pellicle film is bonded to the frame body. This makes it possible to prevent the pellicle film from being damaged. Accordingly, even when the pellicle film is thin, the pellicle film can be bonded to the frame body.

When the support frame for pellicles is such that the multiple front-side recessed grooves are arranged side-by-side in the circumferential direction of the frame body while the front-side suction hole communicates with each front-side recessed groove, a distance from an end portion of the recessed groove to the suction hole can be made shorter. This makes it possible to decrease pressure loss which occurs inside the recessed groove when the air inside the recessed groove is sucked up, and accordingly to efficiently decreases the pressure inside the recessed groove.

The support frame for pellicles may be such that: the back-side recessed groove extending in the circumferential direction of the frame body is formed on the back surface of the frame body; and the back-side suction hole extending from the outer peripheral surface of the frame body to the inner surface of the back-side recessed groove is formed on the frame body.

This configuration decreases pressure inside the back-side recessed groove when air inside the back-side recessed groove is sucked up via the back-side suction hole, and thereby to press the glass substrate against the back surface of the frame body. Accordingly, this configuration no longer requires another member to be pressed against the glass substrate when the glass substrate is bonded to the frame body. This makes it possible to prevent the glass substrate from being damaged.

When the support frame for pellicles is such that the multiple back-side recessed grooves are arranged side-by-side in the circumferential direction of the frame body in the back surface of the frame body while the back-side suction hole communicates with each back-side recessed groove, a distance from an end portion of the back-side recessed groove to the back-side suction hole can be made shorter. This makes it possible to decrease pressure loss which occurs inside the back-side recessed groove when the air inside the back-side recessed groove is sucked up, and accordingly to efficiently decreases the pressure inside the back-side recessed groove.

The support frame for pellicles may be such that: the multiple back-side recessed grooves extending in the circumferential direction of the frame body are arranged side-by-side in the circumferential direction of the frame body; and the back-side suction hole extending from the outer peripheral surface of the frame body to the inner surface of each back-side recessed groove is formed on the frame body. In this case, it is desirable that: the front-side suction holes are each formed between adjacent two of the back-side recessed grooves; and the back-side suction holes are each formed between adjacent two of the front-side recessed grooves.

This configuration does not allow the suction holes to overlap the recesses grooves in the front-back direction, and accordingly makes it possible to secure sufficient strength for the frame body.

When the support frame for pellicles is such that blind pit holes are respectively formed on the bottom surfaces of the recessed grooves while the suction holes are respectively opened in the inner peripheral surfaces of the pit holes, it is possible to make diameters of the suction holes greater than depths of the recessed grooves, and accordingly to raise suction efficiency.

In the support frame for pellicles, it is desirable that: the pit holes are opened in one of the front side and the back side of the frame body; and the bottom surfaces of the pit holes are formed closer to the other of the front side and the back side of the frame body than are those of the suction holes.

This configuration arranges the bottom surface of each pit hole in a position deeper than the corresponding suction hole, and accordingly makes it possible to securely open the whole of an axial cross section of the suction hole in the inner peripheral surface of the pit hole.

When the support frame for pellicles is such that the suction holes are formed at the center of the frame body in the height direction of the frame body, it is possible to equally secure a thickness of the frame body from an inner peripheral surface of each suction hole to the front surface of the frame body, and a thickness of the frame body from the inner peripheral surface of the suction hole to the back surface of the frame body 10. Accordingly, it is possible to increase bending strength of the support frame toward the front and back in a well-balanced manner.

The support frame for pellicles may be such that the suction hole communicates with the middle portion of each recessed groove in the extension direction of the recessed groove.

This configuration makes distances from two end portions of the recessed groove to the suction hole shorter than a configuration in which the suction hole communicates with one of the two end portions of the recessed groove. This makes it possible to decrease the pressure loss which occurs inside the recessed groove when the air inside the recessed groove is sucked up, and accordingly to efficiently decreases the pressure inside the recessed groove.

When the support frame for pellicles is such that through-holes extending from the outer peripheral surface to an inner peripheral surface of the frame body are formed in the frame body, it is desirable that the through-holes are each formed between adjacent two of the recessed grooves in the circumferential direction of the frame body.

When as described above, the through-holes are formed in the frame body, it is possible to prevent a pressure difference from occurring between the inner space of the frame body 10 and the outer space after the pellicle film and the glass substrate are bonded to the support frame. In addition, the foregoing configuration does not allow the through-holes to overlap the recesses grooves in the front-back direction, and accordingly makes it possible to secure sufficient strength for the frame body.

When the support frame for pellicles is such that the multiple front-side suction holes are formed in each side of the frame body, suction force acts on the whole of the front surface of the frame body in a well-balanced manner.

Accordingly, the pellicle film can be evenly pressed against the whole of the front surface of the frame body in a well-balanced manner.

When the support frame for pellicles is such that the frame body includes a pair of front and rear lateral frame portions and a pair of left and right vertical frame portions while multiple jig holes are formed on the outer peripheral surface of the frame body, it is desirable that the jig holes be formed in the two end portions of each of the two lateral frame portions.

It should be noted that the front, rear, left and right in the present invention are set for the purpose of facilitating understanding the configuration of the support frame, and are not intended to specify how the support frame should be configured or used.

When as jigs, pins are inserted into the respective jig holes to retain the support frame, this configuration makes it possible to inhibit each lateral frame portion from warping due to pressing force from the jigs.

Particularly in a case where distances from left and right side edge portions of the frame body to center positions of the jig holes are set at 15% of, or less than, a left-right length of the frame body, the warping of the lateral frame portions 11 can be effectively inhibited.

When the support frame for pellicles is such that the multiple jig holes are formed on the outer peripheral surface of the frame body, it is desirable that each jig hole be an elliptical elongated hole extending in the circumferential direction of the frame body.

The peeling of the support frame off the glass substrate is achieved by: inserting the pins as the jigs into the jig holes in the support frame; and separating the support frame from the glass substrate using the jigs.

Since each jig hole in the support frame is the elliptical elongated hole extending in the circumferential direction of the frame body, when the axial cross section of the corresponding pin as the jig is formed into the shape of an elongated circle extending the circumferential direction of the frame body, the outer peripheral surface of the pin comes into surface contact with the inner peripheral surface of the jig hole. Thereby, stress will not concentrate on any one point between the jig hole and the pin. Accordingly, deformation of the support frame can be inhibited.

When the support frame for pellicles is such that the frame body includes the pair of front and rear lateral frame portions and the pair of left and right vertical frame portions while the multiple jig holes are formed on the outer peripheral surface of the frame body, it is desirable that the jig holes are formed in the two lateral frame portions, and in at least one of four corner portions of the frame body.

It should be noted that the front, rear, left and right in the present invention are set for the purpose of facilitating understanding the configuration of the support frame, and are not intended to specify how the support frame should be configured or used.

The peeling of the support frame off the glass substrate starts with pulling up the jig hole formed in the corner portion of the support frame. After that, the jig holes are sequentially pulled up in order of increasing distance from the jig hole which is pulled up at first. This makes it possible to peel the support frame off the glass substrate while inhibiting the deformation of the support frame.

Advantageous Effects of Invention

Even in the case where the pellicle film is thin, the use of the support frame for pellicles of the present invention makes it possible to prevent the pellicle film from being damaged when the pellicle film is bonded to the frame body.

BRIEF DESCRIPTION OF DRAWINGS

FIG. 4 is a schematic bottom view showing the support frame of the embodiment;

FIG. 5A is a schematic side view showing the support frame of the embodiment;

FIG. 5B is a cross-sectional view taken along the A-A line of FIG. 5A;

FIG. 5C is a cross-sectional view taken along the B-B line of FIG. 5A;

FIG. 5D is a cross-sectional view taken along the C-C line of FIG. 5A;

FIG. 5E is a cross-sectional view taken along the D-D line of FIG. 5A;

FIG. 7 is a schematic plan view showing a support frame of another embodiment, which is configured such that four recessed grooves are formed on each surface of its frame body;

FIG. 8A is a schematic side view showing a support frame of another embodiment, which is configured such that suction holes are arranged in a center portion of its frame body in a height direction of the frame body;

FIG. 8B is a cross-sectional view taken along the E-E line of FIG. 8A;

FIG. 8C is a cross-sectional view of the support frame taken along the F-F line of FIG. 8A;

FIG. 9B is a magnified side view showing how one of the jig holes and a pin as a jig look when the pin is inserted into the jig hole and FIG. 10 is a schematic plan view showing a support frame of another embodiment, which is configured such that jig holes are formed in lateral frame portions, vertical frame portions and corner portions.

DESCRIPTION OF EMBODIMENTS

Hereinafter, embodiments of the present invention will be described in detail with reference to the accompanying drawings.

It should be noted that each drawing of the embodiment schematically illustrates each component of a support frame whenever deemed necessary for the purpose of explaining the support frame in an easy-to-understand manner.

In the following explanation, the front, rear, left, right, front surface and back surface are set for the purpose of explaining the support frame in an easy-to-understand manner, and are not intended to limit the configuration of the support frame.

Figure 1:
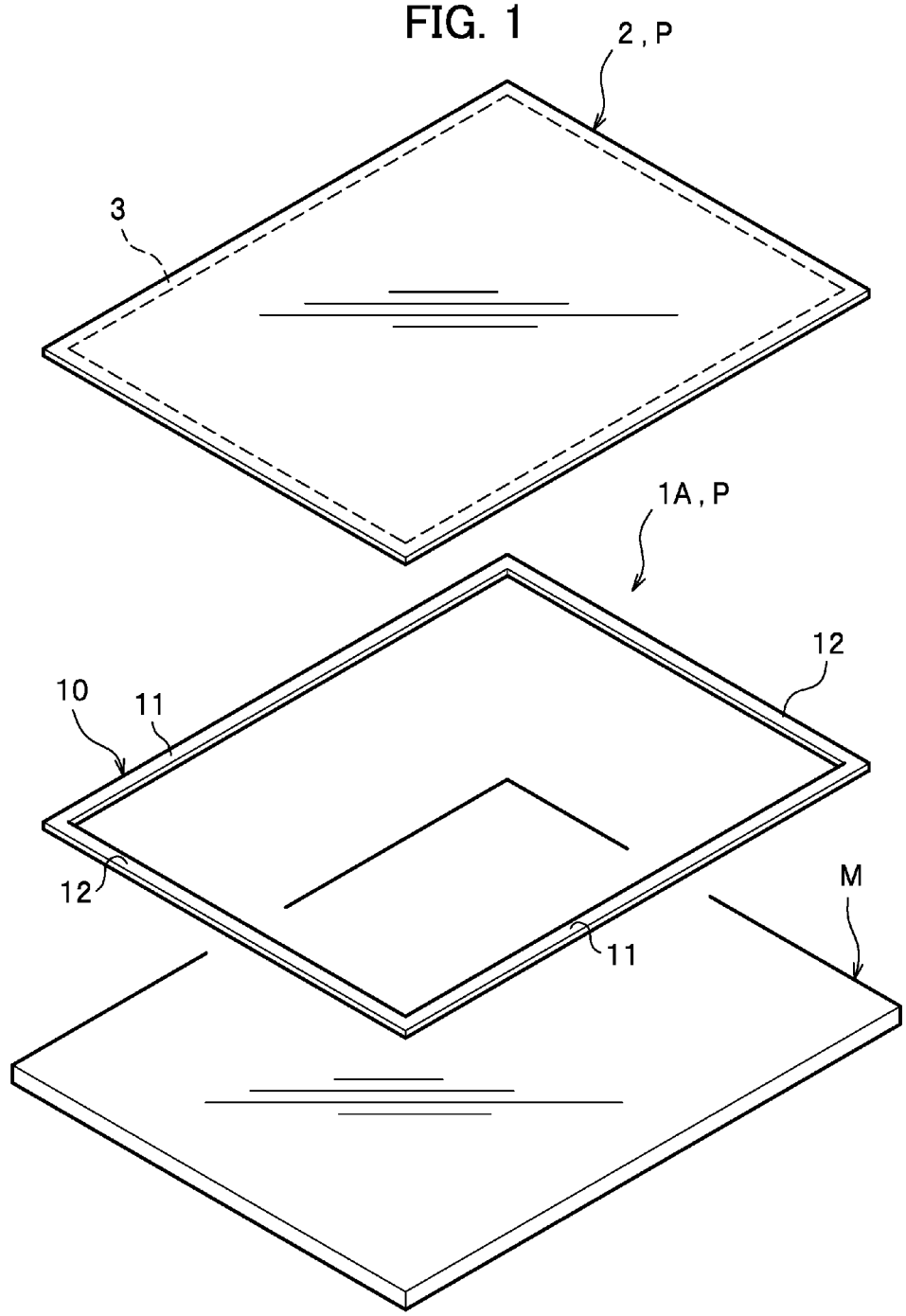
FIG. 1 is a perspective view showing a pellicle and a glass substrate of an embodiment.

As shown in FIG. 1, the support frame 1A of the embodiment is used for pellicles P. The pellicle P is a dust cover for preventing dust and the like from adhering to a front surface Ma of a glass substrate M (a photomask). A transparent substrate is used as the glass substrate M of the embodiment. However, no restriction is imposed on the configuration of the glass substrate M.

The pellicle P includes: the support frame 1A surrounding the entirety of a circuit pattern (not shown) written on the glass substrate M; and a pellicle film 2 provided to and coving a front surface of the support frame 1A.

The support frame 1A includes a frame body 10 which is rectangular in a plan view. The frame body 10 is obtained by extruding an aluminum alloy material.

The frame body 10 is made from: a pair of front and rear lateral frame portions 11, 11; and a pair of left and right vertical frame portions 12, 12. The axial cross sections of each lateral frame portion 11 and each vertical frame portion 12 are shaped like a rectangle.

The two lateral frame portions 11, 11 form the long sides of the frame body 10, while the two vertical frame portions 12, 12 form the short sides of the frame body 10.

The pellicle film 2 is a thin silicon-made film allowing light to pass through. In a plan view, the pellicle film 2 is shaped like a rectangle, and its external shape is the same as that of the support frame 1A.

An outer peripheral edge portion of a back surface of the pellicle film 2 is provided with a silicon-made reinforcement frame 3 which is formed when the pellicle film 2 is produced.

Figure 2:
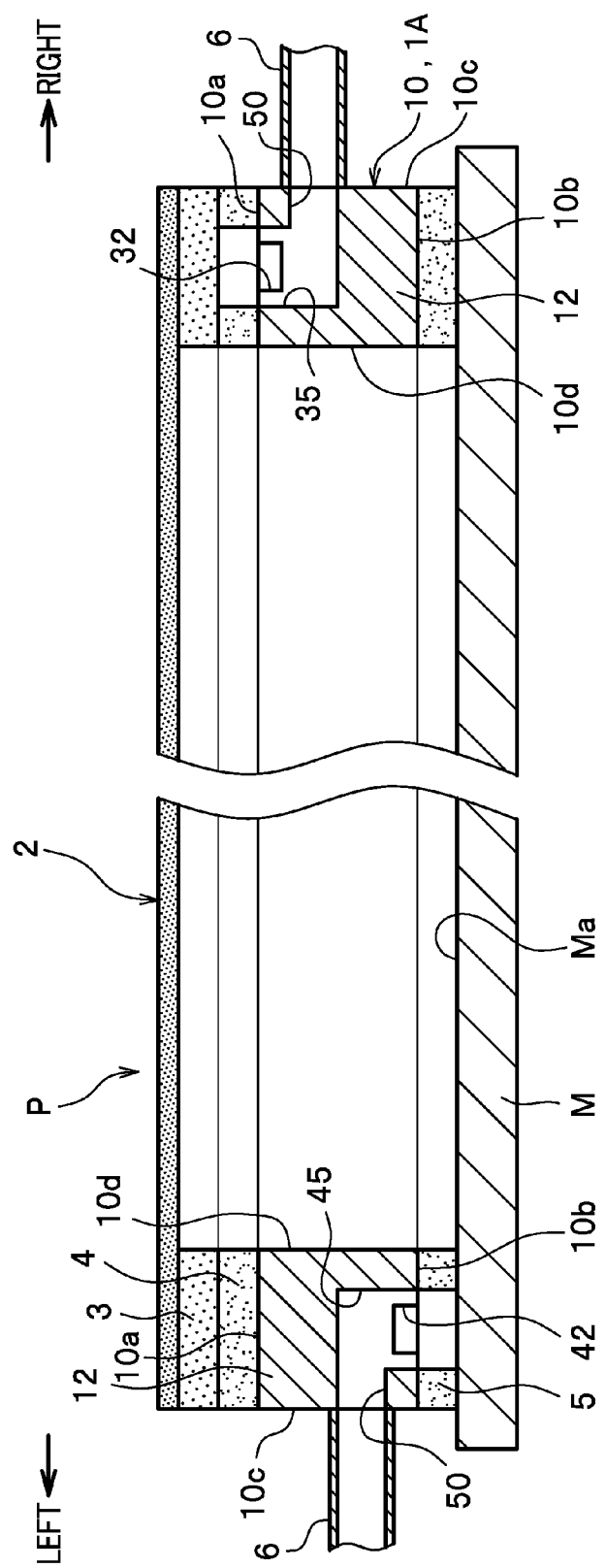
FIG. 2 is a side cross-sectional view showing the pellicle and the glass substrate of the embodiment.

As shown in FIG. 2, the reinforcement frame 3 is a component bonded to the frame body 10 using a bonding layer 4. The reinforcement frame 3 is formed to have the same width as do each lateral frame portion 11 and each vertical frame portion 12 of the frame body 10. When the pellicle film 2 is put on top of a front surface 10a of the frame body 10, the whole of the front surface 10a of the frame body 10 is covered with the reinforcement frame 3.

Figure 3:
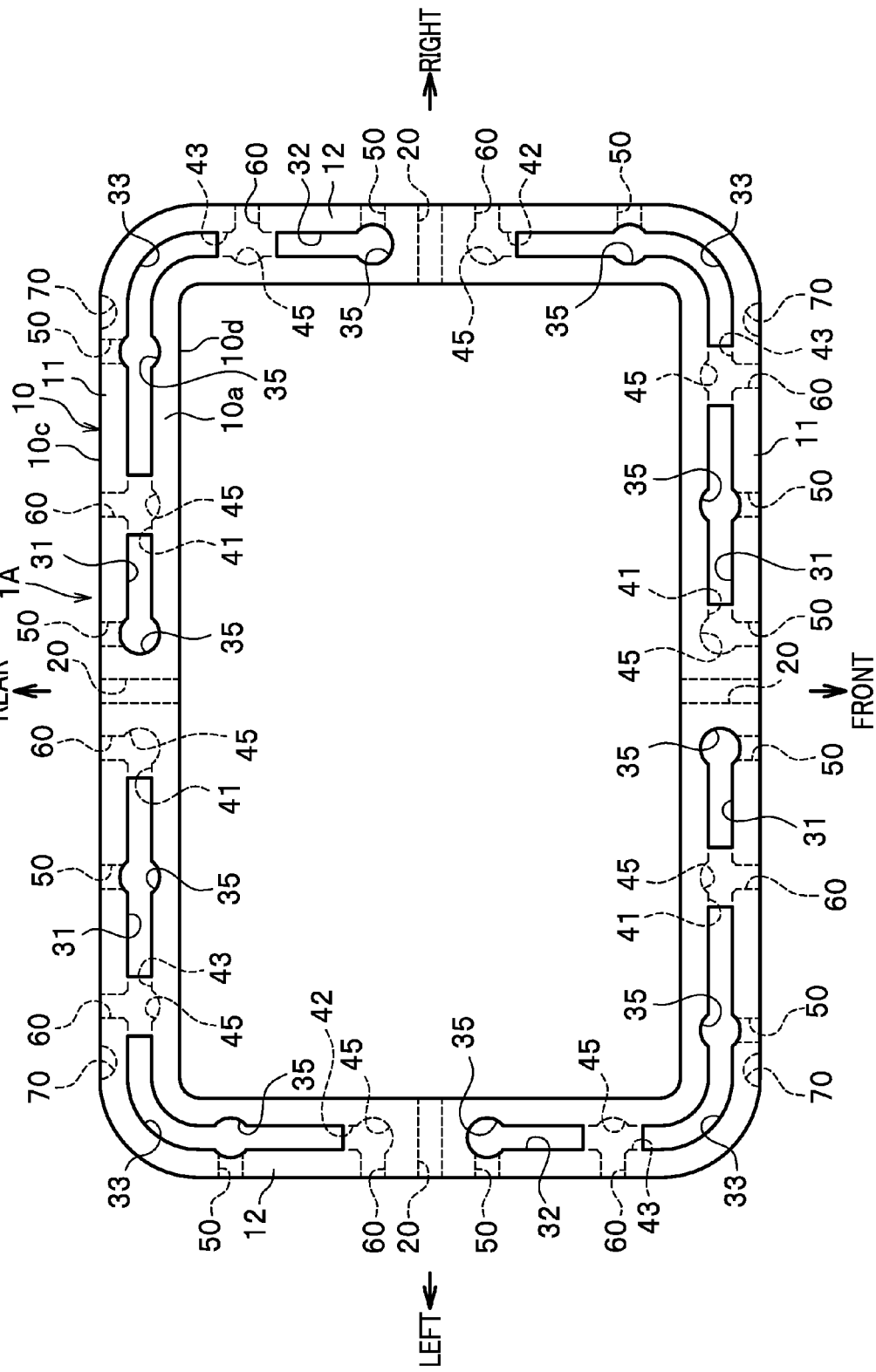
FIG. 3 is a schematic plan view showing a support frame of the embodiment.

As shown in FIG. 3, the frame body 10 includes multiple through-holes 20, multiple front-side recessed grooves 31 to 33, and multiple back-side recessed grooves 41 to 43 which are formed therein.

The frame body 10 further includes multiple front-side suction holes 50, multiple back-side suction holes 60 and multiple jig holes 70 which are formed therein. The front-side suction holes 50 communicate with the front-side recessed grooves 31 to 33. The back-side suction holes 60 communicate with the back-side recessed grooves 41 to 43. Incidentally, the front-side suction holes 50 respectively communicate with the front-side recessed grooves 31 to 33. The back-side suction holes 60 respectively communicate with the back-side recessed grooves 41 to 43.

The through-holes 20 penetrate the frame body 10 from an outer peripheral surface 10c to an inner peripheral surface 10d (see FIG. 5D). As shown in FIG. 5A, the center axis of each through-hole 20 is arranged at a height-directional center of the frame body 10.

As shown in FIG. 3, the through-holes 20 are formed at centers of the front and rear lateral frame portions 11, 11 in a left-right direction of the frame body 10, and at centers of the left and right vertical frame portions 12, 12 in a front-rear direction of the frame body 10. In short, the frame body 10 includes a total of 4 (front, rear, left and right) through-holes 20 formed therein.

The front surface 10a of the frame body 10 includes 10 front-side recessed grooves 31 to 33 which are arranged side-by-side in a circumferential direction of the frame body 10. Each of the recessed grooves 31 to 33 is a groove whose axial cross section is shaped like a rectangle (see FIG. 5C).

Two (left and right) first recessed grooves 31, 31 are formed on the front surface 10a in the front lateral frame portion 11. Each first recessed groove 31 extends linearly in the left-right direction. Furthermore, each first recessed groove 31 is formed at a center of the front surface 10a in the lateral frame portion 11 in the front-rear direction The left and right first recessed grooves 31, 31 are arranged with a center of the lateral frame portion 11 in the left-right direction interposed in between. The through-holes 20 are each arranged between adjacent two of the first recessed grooves 31, 31 when the through-hole 20 is projected onto the front surface 10a of the frame body 10.

In the front lateral frame portion 11, a pit hole 35 is formed in a right end portion of the left first recessed groove 31, while another pit hole 35 is formed in a middle portion of the right first recessed groove 31.

Each pit hole 35 is a blind hole, and its inner diameter is formed larger than a groove width of each first recessed groove 31.

As shown in FIG. 5E, the bottom surface of each pit hole 35 is formed deeper (further backward) than the bottom surface of each first recessed groove 31. The bottom surface of each pit hole 35 is arranged at the center of the frame body 10 in the height direction.

As shown in FIG. 3, two (left and right) first recessed grooves 31, 31 are formed on the front surface 10a in the rear lateral frame portion 11. The two first recessed grooves 31, 31 in the rear lateral frame portion 11 and the two first recessed grooves 31, 31 in the front lateral frame portion 11 possess point symmetry with respect to the center of the frame body 10.

One second recessed groove 32 is formed on the front surface 10a in the left vertical frame portion 12. The second recessed groove 32 extends linearly in the front-rear direction. Furthermore, the second recessed groove 32 is formed on the center of the front surface 10a in the vertical frame portion 12 in the left-right direction.

The second recessed groove 32 in the left vertical frame portion 12 is arranged further forward than the center of the vertical frame portion 12 in the front-rear direction. One through-hole 20 is arranged further rearward than the second recessed groove 32 when the through-hole 20 is projected onto the front surface 10a of the frame body 10.

In addition, a pit hole 35 is formed in a rear end portion of the left second recessed groove 32. The pit hole 35 in the second recessed groove 32 has the same shape as does the pit hole 35 in each first recessed groove 31.

One second recessed groove 32 is formed on the front surface 10a in the right vertical frame portion 12. The second recessed groove 32 in the right vertical frame portion 12 and the second recessed groove 32 in the left vertical frame portion 12 possess point symmetry with respect to the center of the frame body 10.

The third recessed grooves 33 are formed on the front surface 10a of the frame body 10 in the respective front left, front right, rear left and rear right corner portions of the frame body 10. Each third recessed groove 33 bends at a right angle along the corresponding corner portion of the frame body 10. Furthermore, each third recessed groove 33 is formed at the center of the front surface 10a of the frame body 10 in an inside-outside direction of the frame body 10.

The left front third recessed groove 33 is formed extending from the left vertical frame portion 12 to the left front corner portion of the frame body 10 and the front lateral frame portion 11.

The left front third recessed groove 33 is formed such that its part formed on the front lateral frame portion 11 is larger than its part formed on the left vertical frame portion 12.

In the left vertical frame portion 12, the second recessed groove 32 and the third recessed groove 33 are formed with a space interposed in between in the front-rear direction.

A pit hole 35 is formed in a middle portion of the left front third recessed groove 33 in an extension direction of the third recessed groove 33 (or in a part of the lateral frame portion 11). The pit hole 35 in the left front third recessed groove 33 has the same shape as does the pit hole 35 in the first recessed groove 31.

The left rear third recessed groove 33 is formed extending from the left vertical frame portion 12 to the left rear corner portion of the frame body 10 and the rear lateral frame portion 11.

The left rear third recessed groove 33 is formed such that its part formed on the rear lateral frame portion 11 is smaller than its part formed on the left vertical frame portion 12.

In the left vertical frame portion 12, the second recessed groove 32 and the left rear third recessed groove 33 are formed with the center of the vertical frame portion 12 in the front-rear direction interposed in between.

The through-holes 20 are each arranged between the second recessed groove 32 and the left rear third recessed groove 33 which are adjacent to each other in the front-rear direction, when the through-hole 20 is projected onto the front surface 10a in the vertical frame portion 12.

A pit hole 35 is formed in a middle portion of the left rear third recessed groove 33 in an extension direction of the third recessed groove 33 (or in a part of the vertical frame portion 12). The pit hole 35 in the left rear third recessed groove 33 has the same shape as does the pit hole 35 in the first recessed groove 31.

The right front third recessed groove 33 is formed extending from the right vertical frame portion 12 to the right front corner portion of the frame body 10 and the front lateral frame portion 11. Moreover, the right rear third recessed groove 33 is formed extending from the right vertical frame portion 12 to the right rear corner portion of the frame body 10 and the rear lateral frame portion 11.

The right front and rear third recessed grooves 33, 33 and the left front and rear third recessed grooves 33, 33 possess point symmetry with respect to the center of the frame body 10.

The front-side suction holes 50 penetrate the frame body 10 from the outer peripheral surface 10c to inner peripheral surfaces of the front-side pit holes 35, respectively. The front-side suction holes 50 communicate with the front-side recessed grooves 31 to 33 via the pit holes 35.

The frame body 10 includes 10 front-side suction holes 50 which are arranged side-by-side in the circumferential direction of the frame body 10. The suction holes 50 are arranged at almost equal intervals. At least one suction hole 50 is placed on each side of the frame body 10. The suction holes 50 communicate with the pit holes 35 in the recessed grooves 31 to 33. Like in this case, the front-side suction holes 50 respectively communicate with the front-side recessed grooves 31 to 33.

As shown in FIG. 5A, each front-side suction hole 50 is arranged closer to the front surface than is the center of the frame body 10 in the height direction. The lower portions of the front-side suction holes 50 are arranged at the left and right sides of the through-holes 20.

In addition, as shown in FIG. 5E, the thickness of the frame body 10 from the front surface 10a to each front-side suction hole 50 is formed greater than the depth of each front-side recessed groove 31.

As shown in FIG. 4, a back surface 10b of the frame body 10 includes 10 back-side recessed grooves 41 to 43 which are arranged side-by-side in the circumferential direction of the frame body 10.

The shapes of the back-side recessed grooves 41 to 43 are the reverse of the shapes of the overall front-side recessed grooves 31 to 33 (see FIG. 3) formed on the front surface 10a of the frame body 10 with respect to the front-rear direction.

Two (left and right) first recessed grooves 41, 41 are formed on the back surface 10b in each of the front and rear lateral frame portions 11, 11. In addition, one second recessed groove 42 is formed on the back surface 10b in each of the left and right vertical frame portions 12, 12. Moreover, one third recessed groove 43 is formed on the back surface 10b in each of the front left, front right, rear left and rear right corner portions of the frame body 10.

The frame body 10 includes 10 back-side suction holes 60 which are arranged side-by-side in the circumferential direction of the frame body 10, like the front-side suction holes 50. The suction holes 60 are arranged at almost equal intervals. At least one suction hole 60 is placed on each side of the frame body 10.

The back-side suction holes 60 penetrate the frame body 10 from the outer peripheral surface 10c to inner peripheral surfaces of pit holes 45 in the back-side recessed grooves 41 to 43. The back-side suction holes 60 communicate with the back-side recessed grooves 41 to 43 via the pit holes 45.

As shown in FIG. 5A, each back-side suction hole 60 is arranged closer to the back surface than is the center of the frame body 10 in the height direction. The upper portions of the back-side suction holes 60 are arranged at the left and right sides of the through-holes 20.

In addition, as shown in FIG. 5B, the thickness of the frame body 10 from the back surface 10b to each back-side suction hole 60 is formed greater than the depth of each back-side recessed groove 41.

As shown in FIG. 3, in the frame body 10, the back-side suction holes 60, the back-side pit holes 45 and the through-holes 20 projected onto the front surface 10a of the frame body 10 are arranged between the adjacent front-side recessed grooves 31 to 33.

In each lateral frame portion 11, one through-hole 20 is arranged between the front-side first recessed grooves 31, 31.

In addition, in each lateral frame portion 11, the back-side suction hole 60 and the pit hole 45 are arranged between one front-side first recessed groove 31 and the through-hole 20 (see FIG. 5A).

Furthermore, in each lateral frame portion 11, one back-side suction hole 60 and one pit hole 45 are arranged between each front-side first recessed groove 31 and the corresponding front-side third recessed groove 33 (see FIG. 5A).

In each vertical frame portion 12, one through-hole 20 is arranged between the front-side second recessed groove 32 and the front-side third recessed groove 33.

In addition, in each vertical frame portion 12, one back-side suction hole 60 and one pit hole 45 are arranged between the front-side third recessed groove 33 and the through-hole 20.

Furthermore, in each vertical frame portion 12, one back-side suction hole 60 and one pit hole 45 are arranged between the front-side second recessed groove 32 and each front-side third recessed groove 33.

As shown in FIG. 4, in the frame body 10, the front-side suction holes 50, the front-side pit holes 35 and the through-holes 20 projected onto the back surface 10b of the frame body 10 are arranged between the adjacent back-side recessed grooves 41 to 43.

In each lateral frame portion 11, one through-hole 20 is arranged between the back-side first recessed grooves 41, 41.

In addition, in each lateral frame portion 11, one front-side suction hole 50 and one pit hole 35 are arranged between one front-side first recessed groove 41 and the through-hole 20 (see FIG. 5A).

Furthermore, in each lateral frame portion 11, one front-side suction hole 50 and one pit hole 35 are arranged between each back-side first recessed groove 41 and the corresponding back-side third recessed groove 43 (see FIG. 5A).

In each vertical frame portion 12, one through-hole 20 is arranged between the back-side second recessed groove 42 and the back-side third recessed groove 43.

In addition, in each vertical frame portion 12, one front-side suction hole 50 and the front-side pit hole 35 are arranged between the back-side third recessed groove 43 and the through-hole 20.

Furthermore, in each vertical frame portion 12, one front-side suction hole 50 and one front-side pit hole 35 are arranged between the back-side second recessed groove 42 and each back-side third recessed groove 43.

The jig holes 70 are blind round holes formed on the outer peripheral surface 10c of the frame body 10. Jigs (pins) of a retaining device for retaining the support frame 1A are inserted into the jig holes 70 when the support frame 1A is produced, and when the pellicle P (see FIG. 1) is in use.

In the embodiment, as shown in FIG. 5A, each jig hole 70 is arranged at the center of the frame body 10 in the height direction. Nevertheless, the height of the jig holes 70 is not limited. The height and shape of the jig holes 70 are set depending on the jigs to be used.

In the embodiment, as shown in FIG. 3, the jig holes 70 are formed in the two (left and right) end portions of each of the front and rear lateral frame portions 11, 11. In other words, the four jig holes 70 are formed in the front left, front right, rear left and rear right of the support frame 1A.

When the support frame 1A is retained using the retaining device, the jigs (pins) are inserted into the respective jig holes 70. In that case, the jigs press the lateral frame portions 11 into the inside of the frame body 10. Thus, the lateral frame portions 11 warp toward the inside of the frame body 10.

In the embodiment, since the jig holes 70 are formed in the two (left and right) end portions of each of the lateral frame portions 11, the distance between the left and right jig holes 70 in each lateral frame portion 11 is large. This makes it possible to inhibit each lateral frame portion 11 from warping when the support frame 1A is retained using the jigs.

It should be noted that in a case where the distances from the left and right side edge portions of the frame body 10 to the center positions of the jig holes 70 are set at 15% of, or less than, the left-right length of the frame body 10, the warping of the lateral frame portions 11 can be effectively inhibited.

Next, descriptions will be provided for a procedure for bonding the pellicle film 2 and the glass substrate M to the support frame 1A.

To begin with, an adhesive is applied to the front surface 10a of the frame body 10. Thereby, the bonding layer 4 is formed on the front surface 10a of the frame body 10. In that case, the bonding layer 4 needs to be prevented from entering the front-side recessed grooves 31 to 33 (see FIG. 3) and the pit holes 35.

Subsequently, the reinforcement frame 3 of the pellicle film 2 is put on top of the bonding layer 4. Thereby, the front-side recessed grooves 31 to 33 (see FIG. 3) are closed by the pellicle film 2.

In addition, an adhesive is applied to the back surface 10b of the frame body 10. Thereby, an adhesive layer 5 is formed on the back surface 10b of the frame body 10. In that case, the adhesive layer 5 needs to be prevented from entering the back-side recessed grooves 41 to 43 (see FIG. 4) and the pit holes 45.

Subsequently, the front surface Ma of the glass substrate M is put on top of the adhesive layer 5. Thereby, the back-side recessed grooves 41 to 43 (see FIG. 4) are closed by the glass substrate M.

Tip portions of suction pipes 6 are connected to openings of the suction holes 50, 60, respectively. The suction pipes 6 are connected to a suction apparatus, albeit not shown.

Once the suction apparatus sucks up air inside the front-side recessed grooves 31 to 33 (see FIG. 3) via the suction holes 50, pressure inside the front-side recessed grooves 31 to 33 is decreased, and the pellicle film 2 is pressed against the front surface 10a of the frame body 10. Thereby, the pellicle film 2 is bonded to the front surface 10a of the frame body 10 with the bonding layer 4. Thus, the pellicle P is formed.

Once the suction apparatus sucks up air inside the back-side recessed grooves 41 to 43 (see FIG. 4) via the suction holes 60, pressure inside the back-side recessed grooves 41 to 43 is decreased, and the glass substrate M is pressed against the back surface 10b of the frame body 10. Thereby, the glass substrate M is bonded to the back surface 10b of the frame body 10 with the adhesive layer 5. Thus, the pellicle P is bonded to the glass substrate M.

Once the pellicle P is bonded to the glass substrate M according to this procedure, the support frame 1A is interposed between the pellicle film 2 and the glass substrate M, and the pellicle film 2 is arranged in a position away from the front surface Ma of the glass substrate M.

As shown in FIG. 3, in the pellicle P, the through-holes 20 are formed in the frame body 10 of the support frame 1A. Thus, although the front and back of the frame body 10 are closed by the pellicle film 2 and the glass substrate M, the inner space of the frame body 10 communicates with the outer space via the through-holes 20. For this reason, it is possible to prevent a pressure difference from occurring between the inner space of the frame body 10 and the outer space. Accordingly, the pellicle P of the embodiment is suitable for its use under a vacuum condition.

As shown in FIG. 2, in the above-described support frame 1A, the decrease in the pressure inside the front-side recessed grooves 31 to 33 (see FIG. 3) makes it possible to press the pellicle film 2 against the front surface 10a of the frame body 10. This makes it unnecessary to press another member against the pellicle film 2 when the pellicle film 2 is bonded to the frame body 10. Thus, it is possible to prevent the pellicle film 2 from being damaged. Accordingly, even in a case where the pellicle film 2 is thin, the pellicle film 2 can be bonded to the frame body 10.

In the support frame 1A of the embodiment, the decrease in the pressure inside the back-side recessed grooves 41 to 43 makes it possible to press the glass substrate M against the back surface 10b of the frame body 10. This makes it unnecessary to press another member against the glass substrate M when the glass substrate M is bonded to the frame body 10. Thus, it is possible to prevent the glass substrate M from being damaged.

As shown in FIGS. 3 and 4, in the support frame 1A of the embodiment, the multiple front-side recessed grooves 31 to 33 and the multiple back-side recessed grooves 41 to 43 are arranged side-by-side in the circumferential direction of the frame body 10. This configuration makes it possible to shorten the distances from the end portions of the recessed grooves 31 to 33 and 41 to 43 to the corresponding suction holes 50, 60.

Furthermore, in a case where the suction holes 50, 60 communicate with the middle portions of the recessed grooves 31 to 33 and 41 to 43 in the extension directions of the recessed grooves, it is possible to shorten the distances from the two end portions of each of the recessed grooves 31 to 33 to the corresponding suction hole 50, and the distances from the two end portions of each of the recessed grooves 41 to 43 to the corresponding suction hole 60.

These decrease pressure loss which occurs inside the recessed grooves 31 to 33 and 41 to 43 when the air inside the recessed grooves 31 to 33 and 41 to 43 is sucked up via the suction holes 50, 60. Accordingly, it is possible to efficiently decrease the pressure inside the recessed grooves 31 to 33 and 41 to 43.

In the support frame 1A of the embodiment, the blind pit holes 35, 45 are formed on the bottom surfaces of the recessed grooves 31 to 33 and 41 to 43. The suction holes 50, 60 are opened in the inner peripheral surfaces of the pit holes 35, 45 (see FIGS. 5B and 5E). This configuration makes it possible to make the diameters of the suction holes 50, 60 greater than the depths of the recessed grooves 31 to 33 and 41 to 43, and accordingly to raise the suction efficiency.

In the support frame 1A of the embodiment, the multiple suction holes 50, 60 are formed in each side of the frame body 10. Thus, suction force can be made to act on the whole of the front surface 10a of the frame body 10 and the whole of the back surface 10b of the frame body 10 in a well-balanced manner. Accordingly, the pellicle film 2 can be evenly pressed against the whole of the front surface 10a of the frame body 10, while the glass substrate M can be evenly pressed against the whole of the back surface 10b of the frame body 10 in a well-balanced manner.

In the support frame 1A of the embodiment, the front-side suction holes 50 are each formed between adjacent two of the back-side recessed grooves 41 to 43, while the back-side suction holes 60 are each formed between adjacent two of the front-side recessed grooves 31 to 33. Like this, the configuration is such that the suction holes 50 do not overlap the recesses grooves 41 to 43 in a front-back direction while the suction holes 60 do not overlap the recessed groove 31 to 33 in the front-back direction Furthermore, in the support frame 1A of the embodiment, the through-holes 20 are each formed between adjacent two of the recessed grooves 31 to 33 in the circumferential direction of the frame body 10, as well as between adjacent two of the recessed grooves 41 to 43 in the circumferential direction of the frame body 10. The configuration is such that the through-holes 20 do not overlap the recessed grooves 31 to 33 and 41 to 43 in the front-back direction.

For these reason, in the support frame 1A, the thickness of the frame body 10 is sufficiently large even in its parts where the through-holes 20 and the suction holes 50, 60 are formed. Accordingly, it is possible to secure sufficient strength for the frame body 10.

Although the foregoing descriptions have been provided for the embodiment of the present invention, the present invention is not limited to the embodiment, and may be appropriately modified without departing from its gist.

In the embodiment, as shown in FIGS. 3 and 4, the 10 recessed grooves 31 to 33 are formed on the front surface 10a of the frame body 10, and the 10 recessed grooves 41 to 43 are formed on the back surface 10b of the frame body 10. Nevertheless, no limit is imposed on the number of recessed grooves 31 to 33 or the number of recessed grooves 41 to 43.

Figure 6:
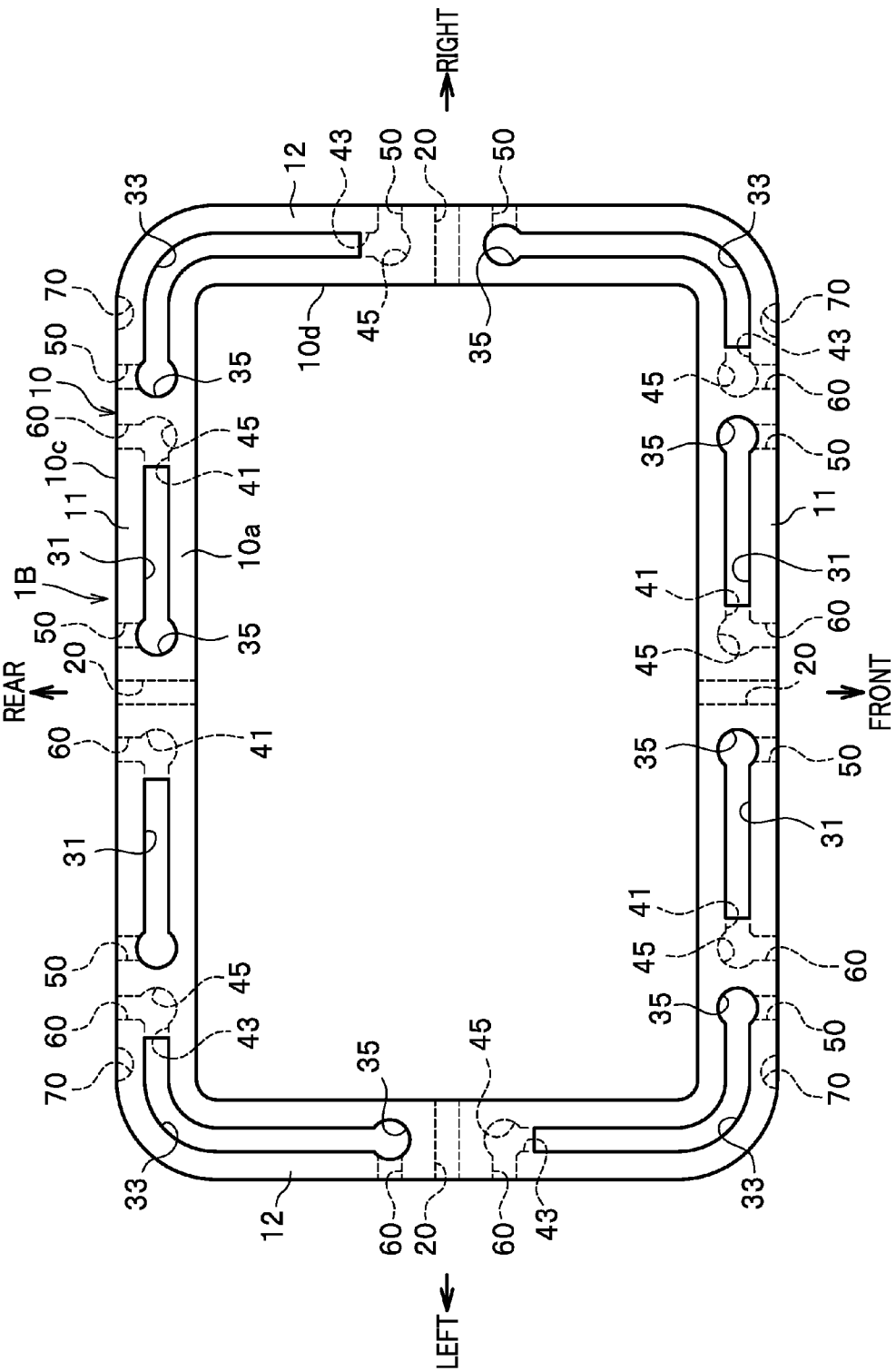
FIG. 6 is a schematic plan view showing a support frame of another embodiment, which is configured such that eight recessed grooves are formed on each surface of its frame body.

For example, like in a support frame 1B shown in FIG. 6, eight recessed grooves 31, 33 may be formed on the front surface 10a of the frame body 10, and eight recessed grooves 41, 43 may be formed on the back surface of the frame body 10. In this configuration, too, the front-side suction holes 50 are each arranged between adjacent two of the back-side recessed grooves 41 and 43 while the back-side suction holes 60 are each arranged between adjacent two of the front-side recessed grooves 31 and 33. Furthermore, the through-holes 20 are each formed between adjacent two of the recessed grooves 31, 33 in the circumferential direction of the frame body 10, as well as between adjacent two of the recessed grooves 41, 43 in the circumferential direction of the frame body 10.

Moreover, like in a support frame 1C shown in FIG. 7, four recessed grooves 34 may be formed on the front surface 10a of the frame body 10, and four recessed grooves 44 may be formed on the back surface of the frame body 10. In this configuration, too, the front-side suction holes 50 are each arranged between adjacent two of the back-side recessed grooves 41, 41 while the back-side suction holes 60 are each arranged between adjacent two of the front-side recessed grooves 34, 34. Furthermore, the through-holes 20 are each formed between adjacent two of the recessed grooves 34 in the circumferential direction of the frame body 10, as well as between adjacent two of the recessed grooves 44 in the circumferential direction of the frame body 10.

In addition, in the embodiment, as shown in FIGS. 3 and 4, the number of front-side recessed grooves 31 to 33 and the number of back-side recessed grooves 41 to 43 are equal to each other. Nevertheless, the number of front-side recessed grooves 31 to 33 and the number of back-side recessed grooves 41 to 43 may be different from each other. Furthermore, one recessed groove may be formed on each of the front and back surfaces 10a, 10b of the frame body 10.

Besides, no restriction is imposed on the arrangement of the recessed grooves. In the case where the third recessed grooves 33, 34 are formed on the corner portions of the frame body 10 as in the embodiment, the corner portions of the pellicle film 2 (see FIG. 1) and the corner portions of the glass substrate M (see FIG. 1) can be securely bonded to the frame body 10.

Moreover, in the embodiment, as shown in FIGS. 3 and 4, one suction hole 50 communicates with each of the recessed grooves 31 to 33, while one suction hole 60 communicates with each of the recessed grooves 41 to 43. Nevertheless, multiple suction holes 50 may communicate with each of the recessed grooves 31 to 33, while multiple suction holes 60 may communicate with each of the recessed grooves 41 to 43.

Furthermore, as shown in FIG. 8A, the suction holes 50, 60 may be formed at the center of the frame body 10 in the height direction. This configuration makes it possible to equally secure the thickness of the frame body 10 from the inner peripheral surface (hole wall surface) of each of the suction holes 50, 60 to the front surface 10a of the frame body 10, and the thickness of the frame body 10 from the inner peripheral surface (hole wall surface) of each of the suction holes 50, 60 to the back surface 10b of the frame body 10. Accordingly, it is possible to increase the bending strength of the support frame 1A toward the front and back in a well-balanced manner.

Moreover, as shown in FIG. 8B, a bottom surface 35a of each front-side pit hole 35 may be formed closer to the back surface 10b of the frame body 10 than is the corresponding suction hole 50, while as shown FIG. 8C, a bottom surface 45a of each back-side pit hole 45 may be formed closer to the front surface 10a of the frame body 10 than is the corresponding suction hole 60.

When, like in this case, the bottom surface 35a of each pit hole 35 is arranged in the position deeper than the corresponding suction hole 50 and the bottom surface 45a of each pit hole 45 is arranged in the position deeper than the corresponding suction hole 60, the whole of the axial cross section of the suction hole 50 can be securely opened in the inner peripheral surface of the pit hole 35 and the whole of the axial cross section of the suction hole 60 can be securely opened in the inner peripheral surface of the pit hole 45.

Figure 9A:
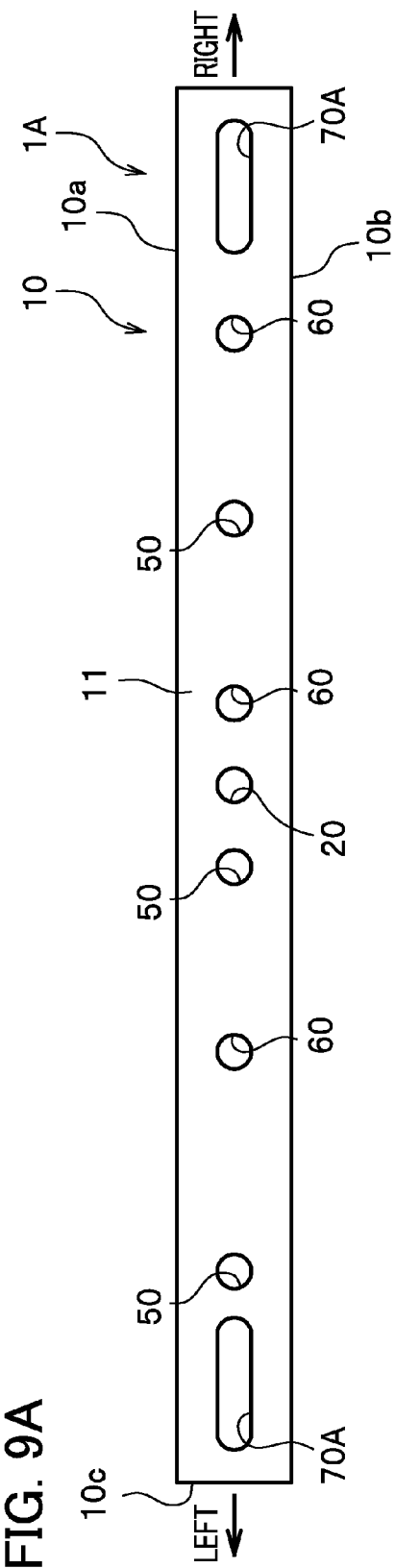
FIG. 9A is a schematic side view showing a support frame of another embodiment, which is configured such that elongated jig holes are formed in the support frame.
Figure 9B:
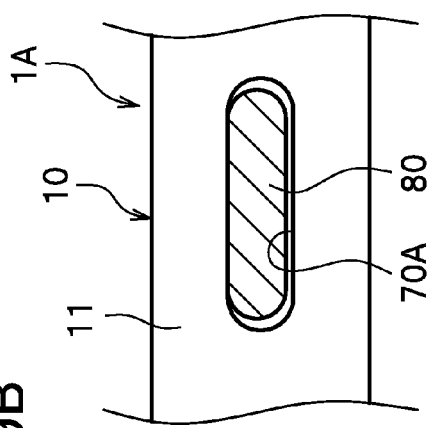

Meanwhile, in the embodiment, as shown in FIG. 5A, the round jig holes 70 are formed. Instead, however, elliptical elongated holes extending in the circumferential direction (left-right direction) of the frame body 10 like the jig holes 70A shown in FIG. 9A may be formed. In this configuration, as shown in FIG. 9B, jigs (pins) 80 are formed with their cross sections each shaped like an elongated circle as well.

Thereby, when the support frame 1A is peeled off the glass substrate M (see FIG. 1), the jigs 80 are inserted into the jig holes 70A in the support frame 1A. Thereby, force with which the support frame 1A is removed from the glass substrate M is given to the support frame 1A using the jigs 80. In that case, flat parts of the inner peripheral surface of each jig hole 70A come into surface contact with flat parts of the outer peripheral surface of the corresponding jig 80. Thus, forces from the respective jigs 80 will not concentrate on any one point on the support frame 1A. Accordingly, deformation of the support frame 1A can be inhibited.

Furthermore, as shown in FIG. 10, seven jig holes 71 to 77 may be formed on the outer peripheral surface 10c of the frame body 10. It should be noted that although the seven jig holes 71 to 77 shown in FIG. 10 are formed as the elliptical elongated holes, they may be round jig holes.

In this configuration, a first jig hole 71 is formed in one (the left front corner portion) of the four corner portions of the frame body 10.

In addition, a second jig hole 72 is formed in the left end portion of the front lateral frame portion 11, and a fourth jig hole 74 is formed in the right end portion of the front lateral frame portion 11.

Furthermore, a fifth jig hole 75 is formed in the left end portion of the rear lateral frame portion 11, and a seventh jig hole 77 is formed in the right end portion of the rear lateral frame portion 11.

Moreover, a third jig hole 73 is formed at the center of the left vertical frame portion 12 in the front-rear direction, and a sixth jig hole 76 is formed at the center of the right vertical frame portion 12 in the front-rear direction.

When the support frame 1A including the seven jig holes 71 to 77 as described above is peeled off the glass substrate M (see FIG. 1), the jigs are inserted into the respective jig holes 71 to 77. Thereafter, the first jig hole 71 in the corner portion is pulled up first. Subsequently, the second jig hole 72 which is the closest to the first jig hole 71 is pulled up. After that, the third jig hole 73, the fourth jig hole 74, the fifth jig hole 75, the sixth jig hole 76 and the seventh jig hole 77 are sequentially pulled up in order of increasing distance from the second jig hole 72. This makes it possible to peel the support frame 1A off the glass substrate M (see FIG. 1) while inhibiting the deformation of the support frame 1A.

REFERENCE SIGNS LIST 1A to 1C: support frame
2: pellicle film
4: bonding layer
5: adhesive layer
10: frame body
10a: front surface
10b: back surface
11: lateral frame portion
12: vertical frame portion
20: through-hole
31: front-side first recessed groove
32: front-side second recessed groove
33: front-side third recessed groove
35: front-side pit hole
41: back-side first recessed groove
42: back-side second recessed groove
43: back-side third recessed groove
45: back-side pit hole
50: front-side suction hole
60: back-side suction hole
70 to 77: jig hole
80: jig
M: glass substrate
P: pellicle

The invention claimed is:

1. A support frame for pellicles comprising:
an aluminum alloy-made frame body, with a pellicle film bonded to a front surface of the frame body, and with a glass substrate bonded to a back surface of the frame body, wherein
a front-side recessed groove extending in a circumferential direction of the frame body is formed on the front surface of the frame body, and
a front-side suction hole extending from an outer peripheral surface of the frame body to an inner surface of the front-side recessed groove is formed on the frame body.

2. The support frame for pellicles, according to claim 1, wherein
a plurality of the front-side recessed grooves are arranged side-by-side in the circumferential direction of the frame body, and
the front-side suction hole communicates with each front-side recessed groove.

3. The support frame for pellicles, according to claim 2, wherein
in the back surface of the frame body, a plurality of back-side recessed grooves extending in the circumferential direction of the frame body are arranged side-by-side in the circumferential direction of the frame body, and
a back-side suction hole extending from the outer peripheral surface of the frame body to an inner surface of each back-side recessed groove is formed on the frame body,
the front-side suction holes are each formed between adjacent two of the back-side recessed grooves, and
the back-side suction holes are each formed between adjacent two of the front-side recessed grooves.

4. The support frame for pellicles, according to claim 3, wherein
blind pit holes are formed on bottom surfaces of the recessed grooves, respectively, and
the suction holes are opened in inner peripheral surfaces of the pit holes, respectively.

5. The support frame for pellicles, according to claim 4, wherein
the pit holes are opened in one of a front side and a back side of the frame body, and
bottom surfaces of the pit holes are formed closer to another of the front side and the back side of the frame body than are the suction holes.

6. The support frame for pellicles, according to claim 2, wherein
the suction hole communicates with a middle portion of the at least one of the recessed grooves in an extension direction of the at least one recessed groove.

7. The support frame for pellicles, according to claim 2, wherein
through-holes extending from the outer peripheral surface to an inner peripheral surface of the frame body are formed in the frame body, and
the through-holes are each formed between adjacent two of the recessed grooves in the circumferential direction of the frame body.

8. The support frame for pellicles, according to claim 1, wherein
a back-side recessed groove extending in the circumferential direction of the frame body is formed on the back surface of the frame body, and
a back-side suction hole extending from the outer peripheral surface of the frame body to an inner surface of the back-side recessed groove is formed on the frame body.

9. The support frame for pellicles, according to claim 8, wherein
a plurality of the back-side recessed grooves are arranged side-by-side in the circumferential direction of the frame body, and
the back-side suction hole communicates with each front-side recessed groove.

10. The support frame for pellicles, according to claim 9, wherein
the suction hole communicates with a middle portion of the at least one of the recessed grooves in an extension direction of the at least one recessed groove.

11. The support frame for pellicles, according to claim 9, wherein
through-holes extending from the outer peripheral surface to an inner peripheral surface of the frame body are formed in the frame body, and
the through-holes are each formed between adjacent two of the recessed grooves in the circumferential direction of the frame body.

12. The support frame for pellicles, according to claim 1, wherein
the suction hole is formed at a center of the frame body in a height direction of the frame body.

13. The support frame for pellicles, according to claim 1, wherein
a plurality of the front-side suction holes are formed in each side of the frame body.

14. The support frame for pellicles, according to claim 1, wherein
the frame body includes a pair of front and rear lateral frame portions and a pair of left and right vertical frame portions,
a plurality of jig holes are formed on the outer peripheral surface of the frame body, and the jig holes are formed in two end portions of each of the two lateral frame portions.

15. The support frame for pellicles, according to claim 1, wherein
a plurality of jig holes are formed on the outer peripheral surface of the frame body, and
each jig hole is an elongated hole extending in the circumferential direction of the frame body.

16. The support frame for pellicles, according to claim 1, wherein
the frame body includes a pair of front and rear lateral frame portions and a pair of left and right vertical frame portions,
a plurality of jig holes are formed on the outer peripheral surface of the frame body,
the jig holes are formed in the two lateral frame portions, and in at least one of four corner portions of the frame body.

\* \* \* \* \*